United States Patent
Park

(10) Patent No.: US 7,515,003 B2
(45) Date of Patent: Apr. 7, 2009

(54) FILTER-BASED LOCK-IN CIRCUITS FOR PLL AND FAST SYSTEM STARTUP

(75) Inventor: Sangbeom Park, San Jose, CA (US)

(73) Assignee: ANA Semiconductor, Tracy, CA (US)

( * ) Notice: Subject to any disclaimer, the term of this patent is extended or adjusted under 35 U.S.C. 154(b) by 125 days.

(21) Appl. No.: 11/809,041

(22) Filed: May 30, 2007

(65) Prior Publication Data

US 2008/0297263 A1     Dec. 4, 2008

(51) Int. Cl.
*H03L 7/00* (2006.01)
(52) U.S. Cl. .............................. 331/16; 331/17; 331/34; 331/177 R; 327/153; 327/161; 327/141
(58) Field of Classification Search .................. 331/16, 331/17, 34, 177 R; 327/141, 153, 161
See application file for complete search history.

(56) References Cited

U.S. PATENT DOCUMENTS 7,132,869 B2 * 11/2006 Park ........................... 327/198
7,148,730 B2 * 12/2006 Park ........................... 327/149
7,215,209 B2 *  5/2007 Park ........................... 331/17
7,224,233 B2 *  5/2007 Park ........................... 331/16

* cited by examiner

Primary Examiner—Arnold Kinkead

(57) ABSTRACT

All embodiments of the present invention basically include an upper transistor and a lower transistor connected in series between a power supply and ground. The upper transistor and the lower transistor have a shared source (or drain) terminal which becomes a single bidirectional node. They further comprise a sensing gate and a logic gate. The sensing inverter has a function of sensing a voltage at the single bidirectional node and comparing it with an input transition voltage since an input terminal of the sensing inverter is connected to the single bidirectional node. An initial voltage at the single bidirectional node of the filter-based lock-in circuit is almost the same as the input transition voltage of the sensing inverter, where the input transition voltage is an input voltage which causes an output voltage to be $$\frac{V_{DD}}{2}.$$

Consequently, all embodiments of the present invention provide a fast lock-in time performance and achieve a drastic improvement in system startup time, system latency time, system simulation time, system test time, cost, and time to market

20 Claims, 12 Drawing Sheets

500

520 (An example of a PLL including the basic filter-based lock-in circuit 430)

530 (Lock-in time measurement)

700

1000

FILTER-BASED LOCK-IN CIRCUITS FOR PLL AND FAST SYSTEM STARTUP

FIELD OF THE INVENTION

The present invention relates to the field of filter-based lock-in circuit for fast system startup more particularly to phase-locked loop and very fast system startup using filter-based lock-in circuit

BACKGROUND ART

Phase-looked loop is a vitally important device. Phase-looked loop is analog and mixed signal building block used always in subsystem, system-on-chip, system IC, memory, telecommunication, communication, navigation system, computer, computer peripherals, automotive, networks, digital systems, consumer electronics, industrial, instrumentation, and any other fields that require frequency synthesizing, clock recovery, synchronization, clock generation, and/or the system's clock distribution. Phase-looked loop is a very versatile building block suitable for a variety of frequency synthesis, clock recovery, clock generation, and synchronization applications.

Prior Art FIG. 1 shows two types of conventional phase-locked loops, which are a conventional third-order phase-locked loop 110 and a conventional fourth-order phase-locked loop 120. The conventional third-order phase-locked loop 110 typically consists of a phase-frequency detector (or phase detector), a charge-pump, a second-order low-pass filter, a voltage-controlled oscillator, and a frequency divider in a loop. In addition, the conventional fourth-order phase-locked loop 120 typically consists of a phase-frequency detector (or phase detector), a charge-pump, a third-order low-pass filter, a buffer amplifier (or a gain amplifier), a voltage-controlled oscillator, and a frequency divider in a loop. Assuming that the frequency divider is considered as unity, the phase detector is a block that has an output voltage with an average value proportional to the phase difference between the input signal and the output of the voltage-controlled oscillator. The charge-pump either injects the charge into the low-pass filter or subtracts the charge from the low-pass filter, depending on the outputs of the phase-frequency detector (or phase detector). Therefore, change in the low-pass filter's output voltage is used to drive the voltage-controlled oscillator. The negative feedback of the loop results in the output of the voltage-controlled oscillator being synchronized with the input signal. As a result, the phase-locked loop is in lock.

In the conventional phase-locked loops 110 and 120 of Prior Art FIG. 1, lock-in time is usually defined as time that is required to attain lock from an initial loop condition. In addition, system latency is here defined as an amount of time that passes from the generation of an event (i.e., the moment power is on, the moment something is initiated) until its realization (i.e., execution, the moment an effect begins). System latency is introduced into hardware, firmware, operating system (i.e., system software), kernel, and application software. System latency used here is hardware-related. However, the conventional phase-locked loops 110 and 120 have suffered from slow locking, which has increased system startup time. However, PLL synthesizers for wireless applications must provide fast lock-in time. For example, lock-in times of these PLLs which are used in GSM (i.e., global system for mobile), CDMA (i.e., code-division multiple access), AMPS (i.e., advanced mobile phone service), and TDMA (i.e., time-division multiple access) must be quick-within millisecond or less. Furthermore, frequency synthesizers are critical to both receivers and transmitters in a cellular/PCS handset In its digital mode, a fast lock-in time of less than 2 ms is required to satisfy MAHO (i.e., mobile-assisted hand-off operation) requirements. In its analog mode, UHF (i.e., ultra high frequency) synthesizer requires a fast lock-in time requirement in channel-scan mode. Recently lock-in times of PLL synthesizers for GSM evolution GPRS (i.e., general packet radio service), HSCSD (i.e., high-speed circuit-switched data), and EDGE (i.e., enhanced data rates for GSM evolution) are required to be fast Lock-in times of PLL synthesizers for future generation mobile technology might be required to be much faster. Moreover, PLL synthesizer for RBDS (i.e., radio broadcast data system) usually locks in 500 microseconds.

In addition, time-to-market has demanded to build and simulate a complete system which incorporates realistic and accurate behavioral representation for all design components including PLL-based clock distribution before tape-out PLL is used to synchronize all communications within the system. However, if a PLL has a slow lock-in time performance, it will prohibit the PLL behavior from being incorporated into the complete and realistic system simulation. The PLL behavior without lock-in time degrades simulation accuracy and adds serious bottleneck to the complete and realistic system simulation. Therefore, a fast lock-in time performance is one of main factors to obtain quick and accurate environment for the entire systems and to quickly and accurately verify the analog, digital, firmware, and software components of any large systems because the simulation time of the entire system containing PLL(s) and/or PLL-based clock distribution is absolutely proportional to time required the phase-locked loop(s) to lock.

System users have demanded to save time booting up their low-end systems such as personal computers and single-user workstations. The speed of system bootup time partially depends on how to use windows system. Moreover, the speed of system bootup time has also been degraded by the hardware system including conventional PLLs. Thus, fast lock-in time performance definitely enables any system to start up fast so that users can save wait time greatly. Even though products including USB interfaces meet the USB specification, they should operate under Windows or Mac OS (i.e., operating system) after bootup time. The bootup time depends upon start-up time of hardware system and how long the software comes loaded on the computer. In addition, since the USB isochronous mode packets arrive on 1 KHz intervals, the USB clock generator PLL must lock within 1 msec.

It has taken a long time to test the conventional phase-locked loops after fabrication since the test time of phase-locked loop circuits is absolutely proportional to time required the phase-locked loops to lock. In addition, it has taken a long time to test any system containing the conventional phase-locked loops. Test can occur at the wafer, at the packed-chip, multi-chip modules (i.e., MCMs), card, board, and system level. Test such as ad-hoc test, pseudo-random sequence generator (i.e., PRSG), built-in self-test (i.e., BIST) or stop-on-count-or-error (i.e., SOCE) has required clock generator PLL on chip, card, board, or system. In these tests, fast lock-in time performance highly improved system test time to keep the manufacturing cost low.

Shorter system simulation time and system test time translate into tremendous cost saving and greatly decrease time to market As stated so far, fast lock-in time performance plays a key role in modern technology and will be extremely crucial to the future technology because every system LSI has at least one PLL. However, unfortunately the conventional phase-locked loop 110 and 120 of Prior Art FIG. 1 is very inefficient to implement in an integrated circuit, system-on-chip (SOC), monolithic circuit, or discrete circuits.

Thus, what is desperately needed is a cost-effective filter-based lock-in circuit for a system which attains a drastic improvement in system startup time, system latency time, system simulation time, system test time, and time-to-market. The present invention satisfies these needs by providing filter-based lock-in circuits to speed up any system startup time, system test time, and the complete and realistic system simulation and by simply adding a filter-based lock-in circuit to a junction between a resistor and capacitor coupled serially in a filter.

SUMMARY OF THE INVENTION

The basic architecture of the filter-based lock-in circuits basically consists of an upper transistor and a lower transistor that are connected in series between a power supply and ground in a path from the power supply to ground. The upper transistor and the lower transistor have a shared source (or drain) terminal which becomes a single bidirectional node. The basic architecture further comprises a sensing inverter and a logic gate. The sensing inverter has a function of sensing a voltage at the single bidirectional node and comparing it with an input transition voltage since an input terminal of the sensing inverter is connected to the single bidirectional node. An initial voltage at the single bidirectional node of the filter-based lock-in circuit is almost the same as the input transition voltage of the sensing inverter, where the input transition voltage is an input voltage which causes an output voltage to be $$\frac{V_{DD}}{2}.$$

The logic gate is a two-input NAND gate which has one input voltage inverted from a power-down pin voltage and the other input terminal coupled to the output terminal of the sensing inverter. An alternative to the NAND gate (i.e., two-input NAND gate) is a combination of an inverter and a two-input NOR gate that are coupled. The NOR (i.e., two-input NOR gate) has one input voltage serving as a power-down pin voltage and the other input voltage inverted from the output voltage of the sensing inverter.

Consequently, all filter-based lock-in circuits solve serious harmonic locking problems and provide a fast lock-in time so that any system including PLL should not have long wait time. In addition, the present invention has different embodiments with a drastic improvement in system startup time, system latency time, system simulation time, system test time, cost, and time to market.

BRIEF DESCRIPTION OF THE DRAWINGS

The accompanying drawings, which are incorporated in and form a part of this specification, illustrate all embodiments of the invention and, together with the description, serve to explain the principles of the invention.

Prior Art

DESCRIPTION OF THE PREFERRED EMBODIMENTS

In the following detailed description of the present invention, the filter-based lock-in circuits for phase-locked loop and fast system start-up time, numerous specific details are set forth in order to provide a thorough understanding of the present invention. However, it will be obvious to one skilled in the art that the present invention may be practiced without these specific details. In other instances, well known methods, procedures, CMOS digital gates, components, and metal-oxide-semiconductor field-effect transistor (MOSFET) device physics have not been described in detail so as not unnecessarily obscure aspects of the present invention.

Figure 1:
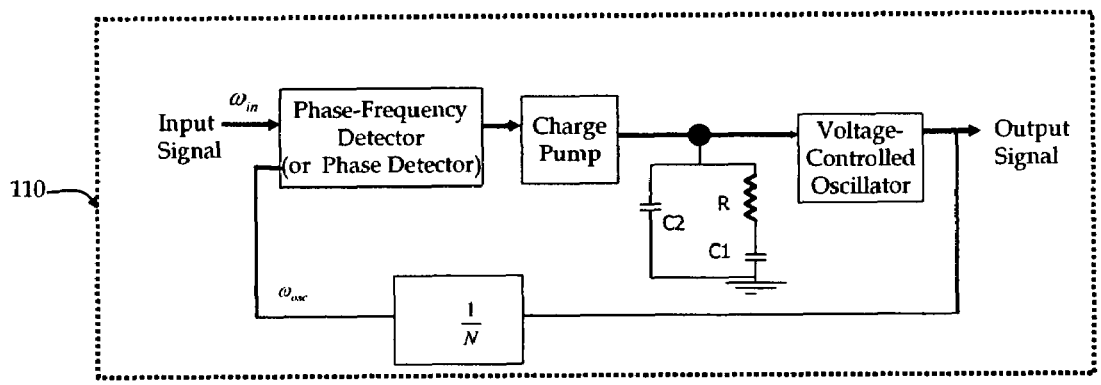
FIG. 1 illustrates a conventional third-order phase-locked loop and a conventional fourth-order phase-locked loop.
Figure 1:
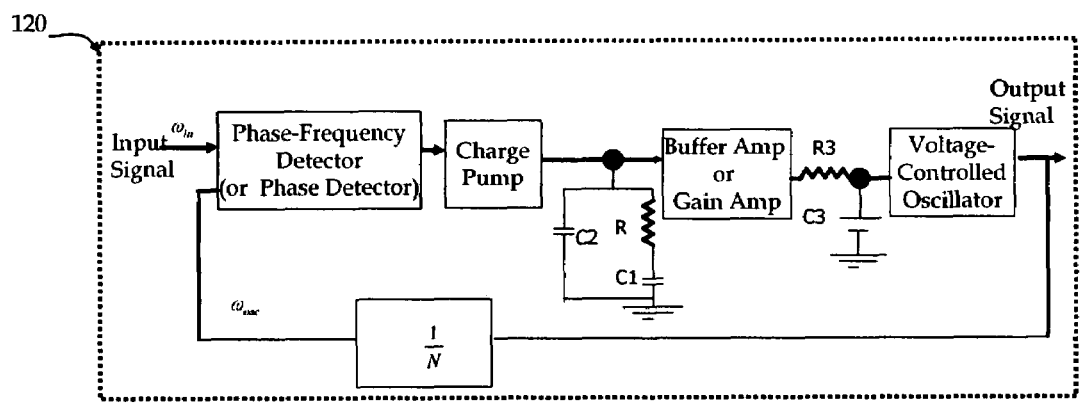
Figure 2:
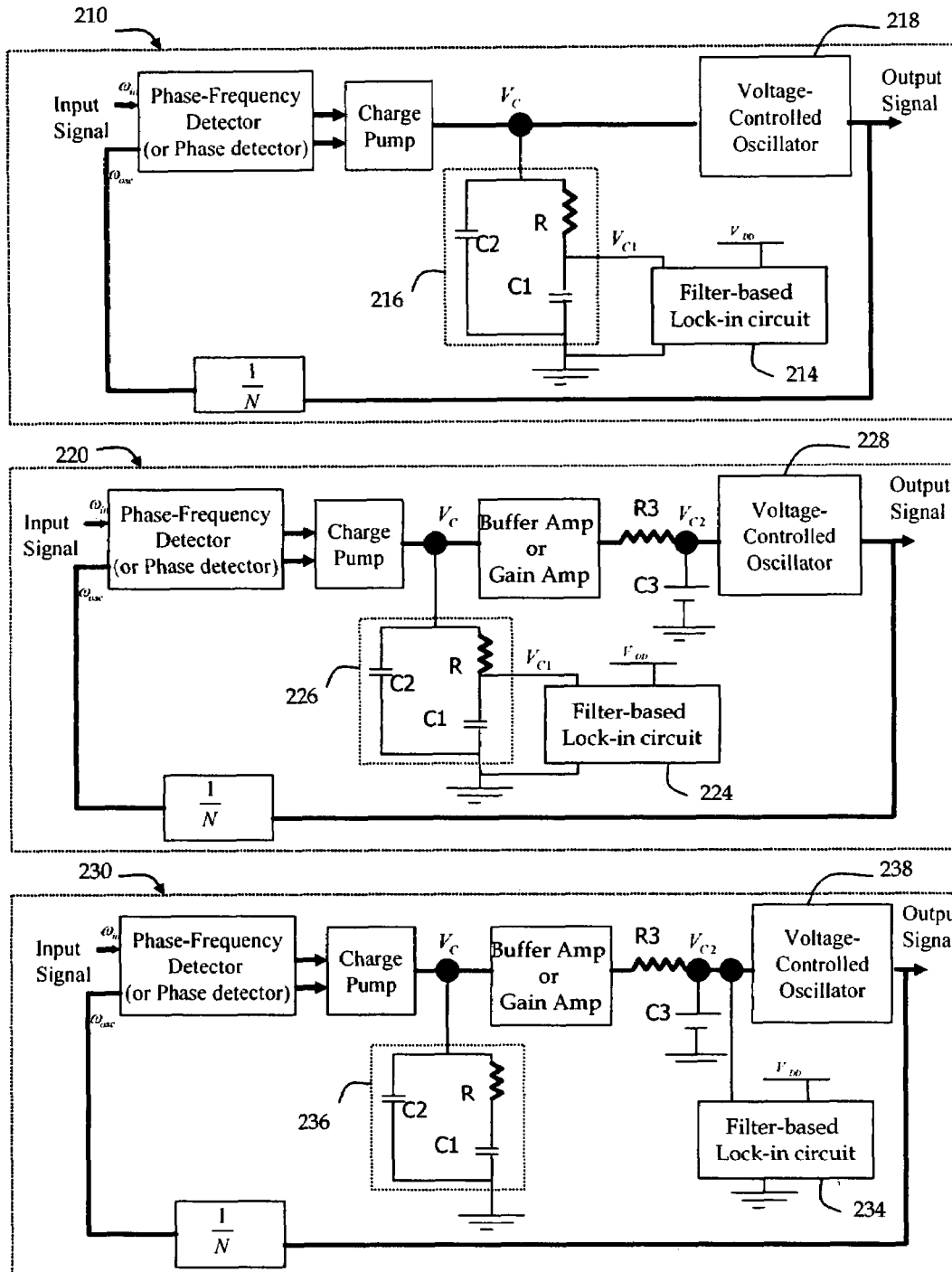
FIG. 2 illustrates three exemplary embodiments of a phase-locked loop including a block diagram of a filter-based lock-in circuit in accordance with the present invention.

FIG. 2 illustrates three exemplary embodiments of a phase-locked loop including a block diagram of a filter-based lock-in circuit in accordance with the present invention. A first block diagram of a filter-based lock-in circuit 214 has a single bidirectional node, which is connected to a junction between a resistor R and a capacitor $C_1$ coupled serially in a second-order low-pass filter 216, as seen in a third-order phase-locked loop 210 shown in FIG. 2. A second block diagram of a filter-based lock-in circuit 224 has a single bidirectional node, which is connected to a junction between a resistor R and a capacitor $C_1$ coupled serially in a second-order low-pass filter 226, as seen in a fourth-order phase-locked loop 220. A third block diagram of a filter-based lock-in circuit 234 has a single bidirectional node, which is connected to a junction between a resistor $R_3$ and a capacitor $C_3$ in a first-order low-pass filter, as seen in a fourth-order phase-locked loop 230. In FIG. 2, the second-order low-pass filter 216, 226, or 236 is coupled between $V_C$ and ground, and the capacitor $C_3$ in the first-order low-pass filter shown in the fourth-order phase-locked loop 220 or 230 is coupled between $V_{C2}$ and ground.

Figure 3:
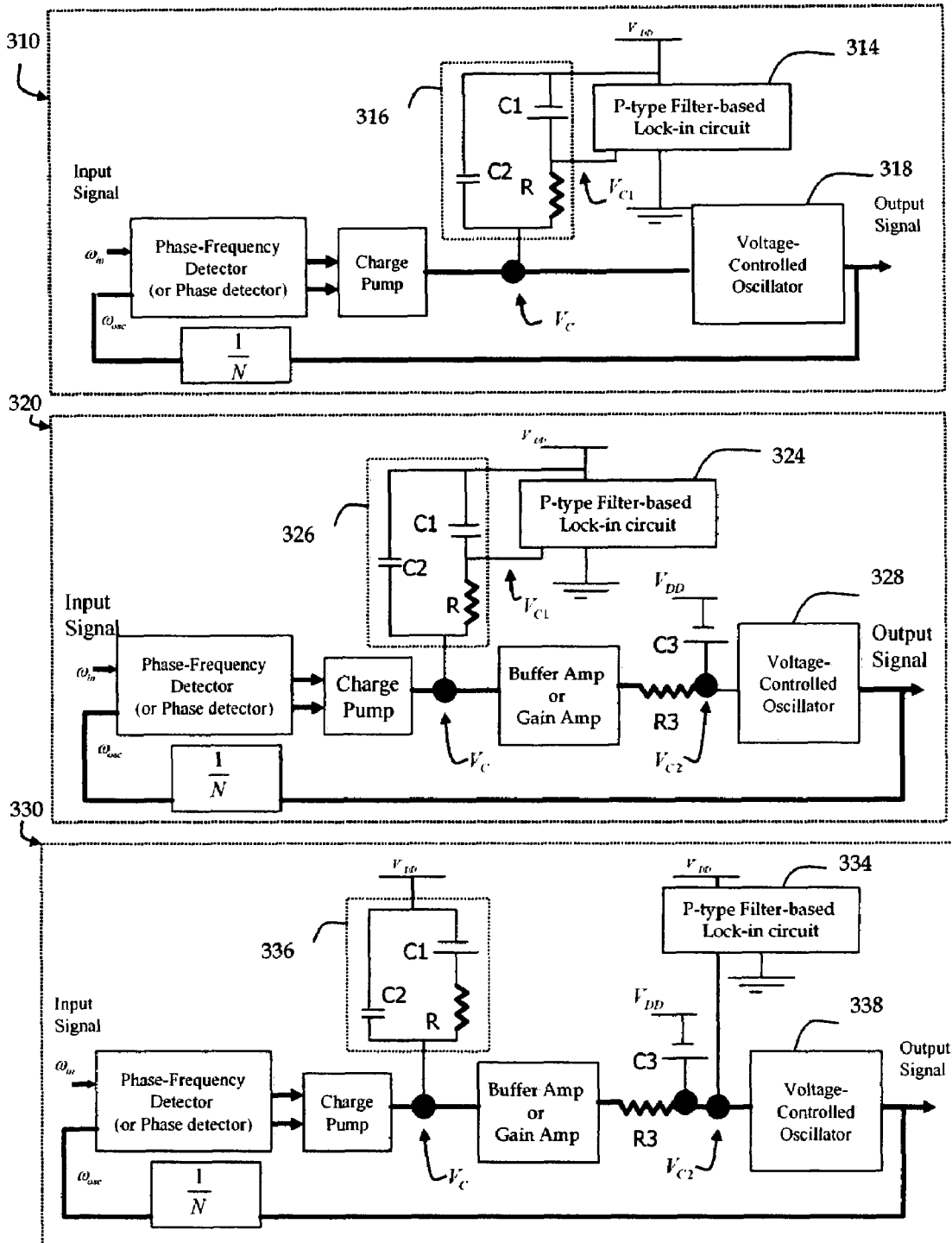
FIG. 3 illustrates three exemplary embodiments of a p-type phase-locked loop including a block diagram of a p-type filter-based lock-in circuit according to the present invention.

FIG. 3 illustrates three exemplary embodiments of a p-type phase-locked loop including a block diagram of a p-type filter-based lock-in circuit according to the present invention. A first block diagram of a p-type filter-based lock-in circuit 314 has a single bidirectional node, which is connected to a junction between a resistor R and a capacitor C, coupled serially in a second-order low-pass filter 316, as seen in a p-type third-order phase-locked loop 310 shown in FIG. 3. A second block diagram of a p-type filter-based lock-in circuit 324 has a single bidirectional node, which is connected to a junction between a resistor R and a capacitor $C_1$ coupled serially in a second-order low-pass filter 326, as seen in a p-type fourth-order phase-locked loop 320. A third block diagram of a p-type filter-based lock-in circuit 334 has a single bidirectional node, which is connected to a junction between a resistor $R_3$ and a capacitor $C_3$ in a first order low-pass filter, as seen in a p-type fourth-order phase-locked loop 330. In FIG. 3, the second-order low-pass filter 316, 326, or 336 is coupled between $V_C$ and a power supply, and the capacitor $C_3$ in the first order low-pass filter shown in the p-type fourth-order phase-locked loop 320 or 330 is coupled between $V_{C2}$ and the power supply.

Figure 4:
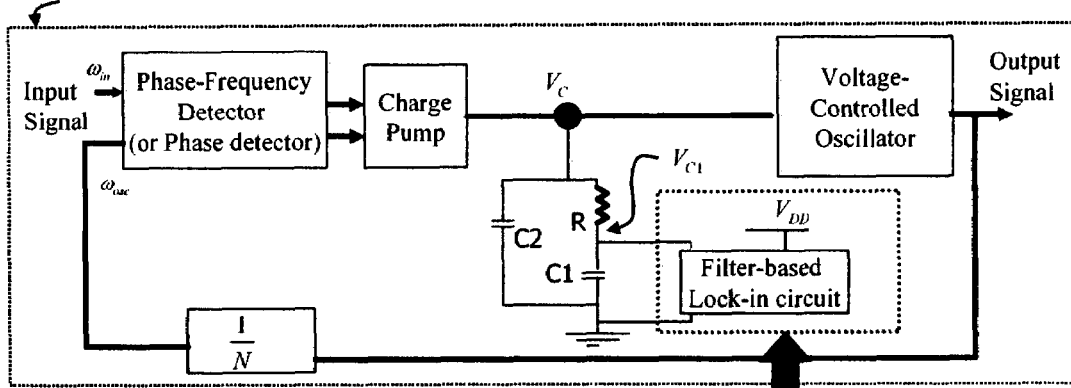
FIG. 4 illustrates one of three exemplary embodiments of a phase-locked loop including a first exemplary embodiment of a basic filter-based lock-in circuit and voltage transfer characteristic of a sensing inverter in accordance with the present invention.
Figure 4:
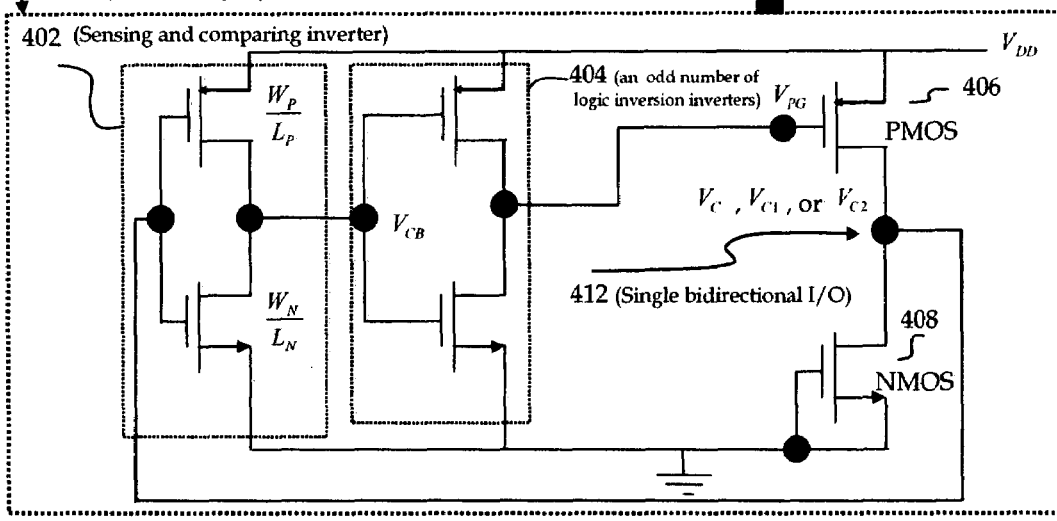
Figure 4:
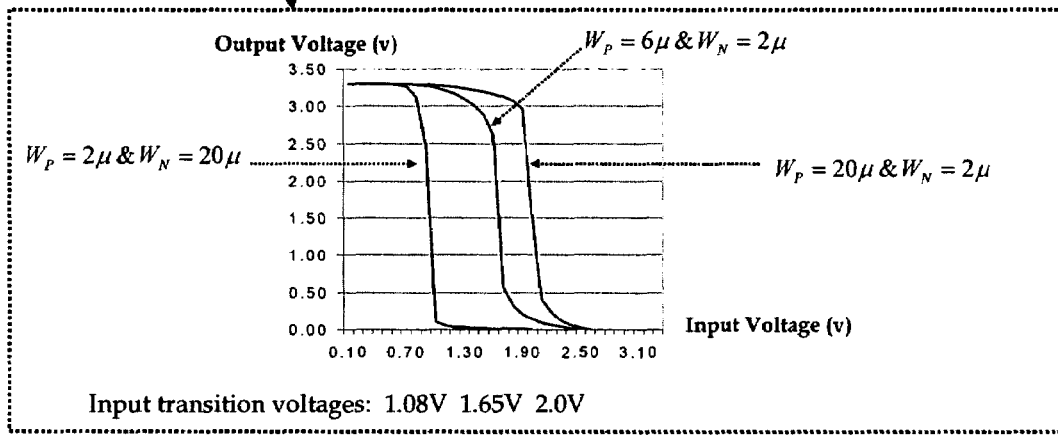

FIG. 4 illustrates one of three exemplary embodiments of a phase-locked loop including a first exemplary embodiment of a basic filter-based lock-in circuit and voltage transfer characteristic of a sensing inverter in accordance with the present invention. The basic filter-based lock-in circuit 430 basically consists of a PMOS transistor 406 and an NMOS transistor 408 that are connected in series between a power supply and ground in a path from the power supply to ground. The circuit 430 further comprises a sensing inverter 402 and an odd number of logic inversion inverters 404. In addition, it should be aware that a gate terminal of the NMOS transistor 408 is connected to ground in order to turn off the NMOS transistor 408 all the time unless the gate terminal of the NMOS transistor 408 is controlled by a power down pin that controls power down mode. In this embodiment, the PMOS transistor 406 and NMOS transistor 408 have a shared drain terminal, which becomes a single bidirectional node 412 that is also connected to an input terminal of the sensing inverter 402. An input transition voltage (or a midpoint voltage) of the sensing inverter 402 is here defined as an input voltage which causes an output voltage to be $$\frac{V_{DD}}{2}.$$

Input transition voltages of the sensing inverter 402 for several values of device aspect ratio are measured where $V_{DD}$ is 3.3V and $L_P(=L_n)$ is 0.35 um, as shown in voltage transfer characteristic 450. An initial voltage at the single bidirectional node of the basic filter-based lock-in circuit 430 is almost the same as the input transition voltage of the sensing inverter 402.

Since the PMOS transistor 406 and NMOS transistor 408 are located near power supply and ground, respectively, the source terminals of the PMOS transistor 406 and NMOS transistor 408 are easily tied to the power supply and ground, respectively, when they are laid out But, for instance, dummy devices sometime cause LVS (i.e., layout versus schematic) error. Likewise, any PMOS transistor whose drain terminal has to be connected to ground might often cause confusion and verification error because power supply bus runs near PMOS transistor groups and ground bus runs near NMOS transistor groups. For this reason, the circuit 430 was developed using a general layout guideline to minimize LVS errors.

Figure 5:
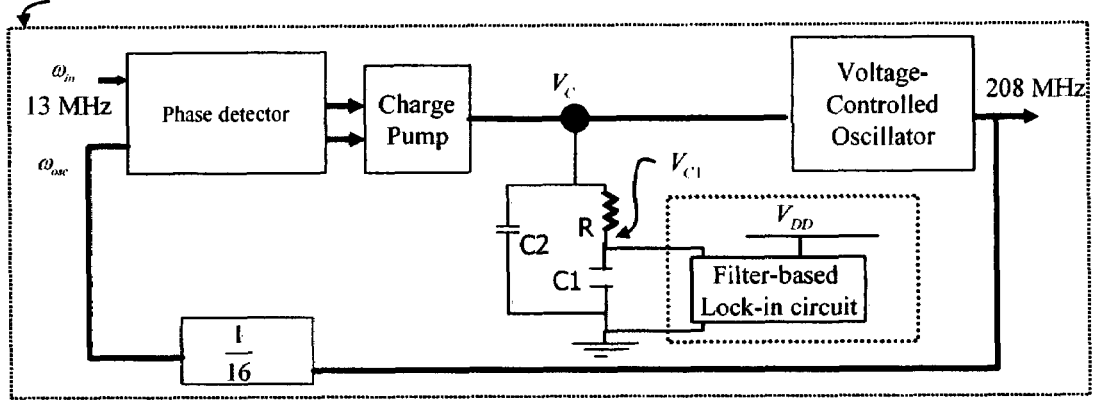
FIG. 5 illustrates an example of a phase-locked loop 520 including the basic filter-based lock-in circuit 430 and its lock-in time measurement according to the present invention.
Figure 5:
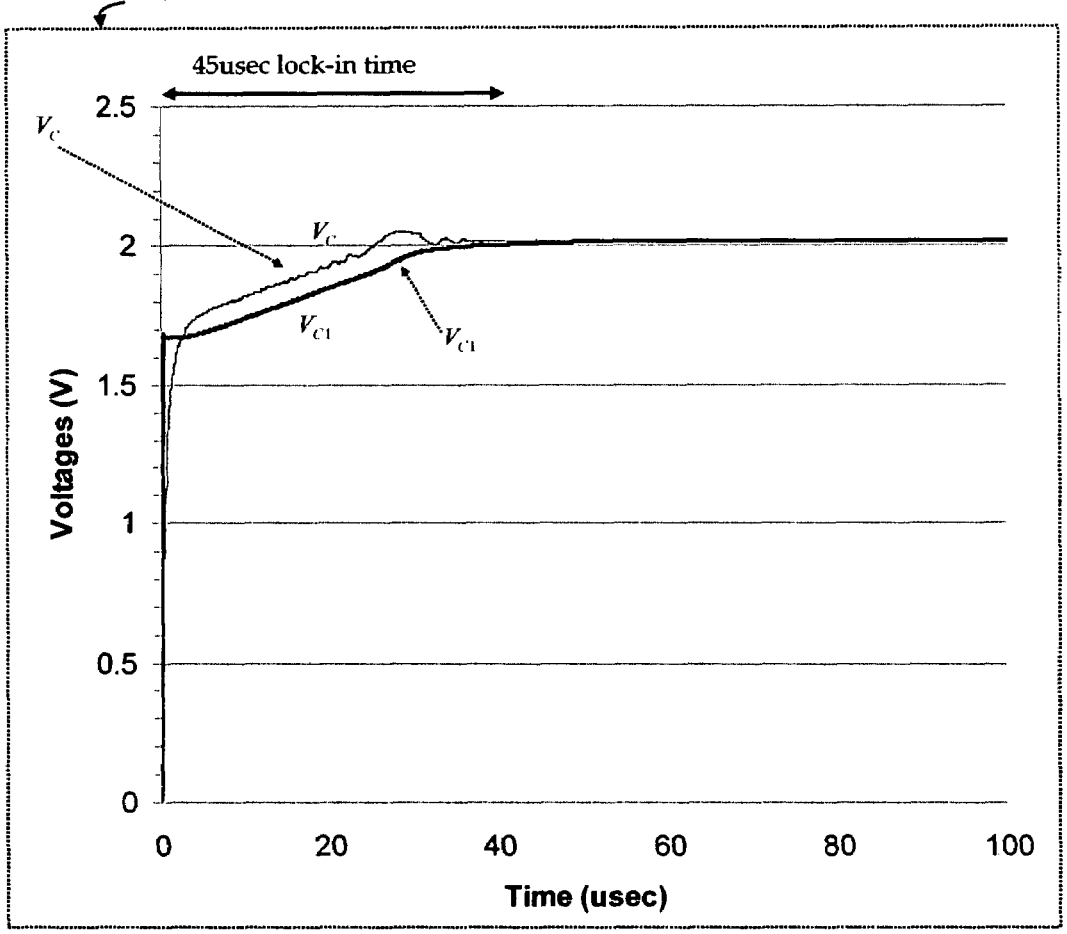

FIG. 5 illustrates an example of a phase-locked loop 520 including the basic filter-based lock-in circuit 430 and its lock-in time measurement according to the present invention. A plot 530 shows 45 microsecond lock-in time which greatly improves lock-in time and system startup performance. It is much faster than 500 microseconds which is required for RBDS (i.e., radio Broadcast data system).

Figure 6:
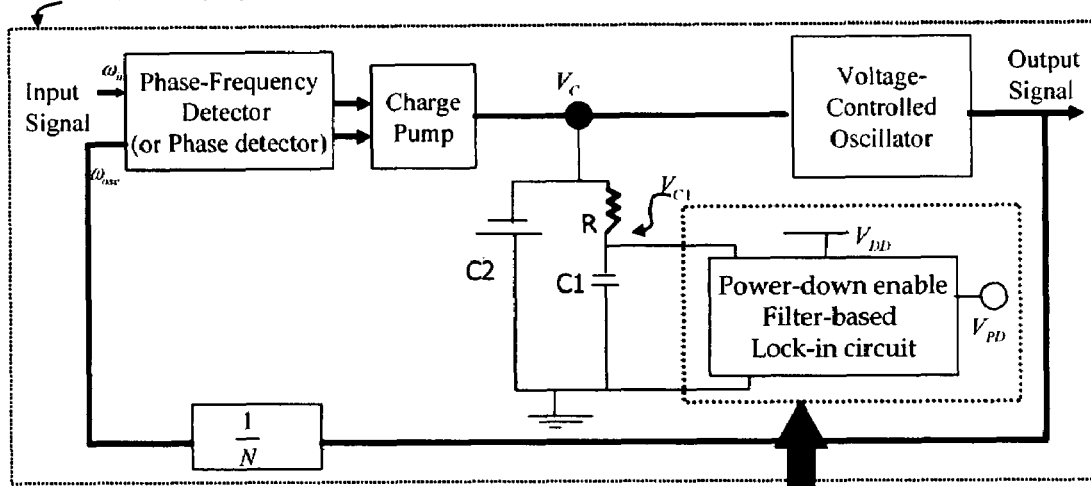
FIG. 6 illustrates an exemplary embodiment of a phase-locked loop including a power-down enable filter-based lock-in circuit in accordance with the present invention.
Figure 6:
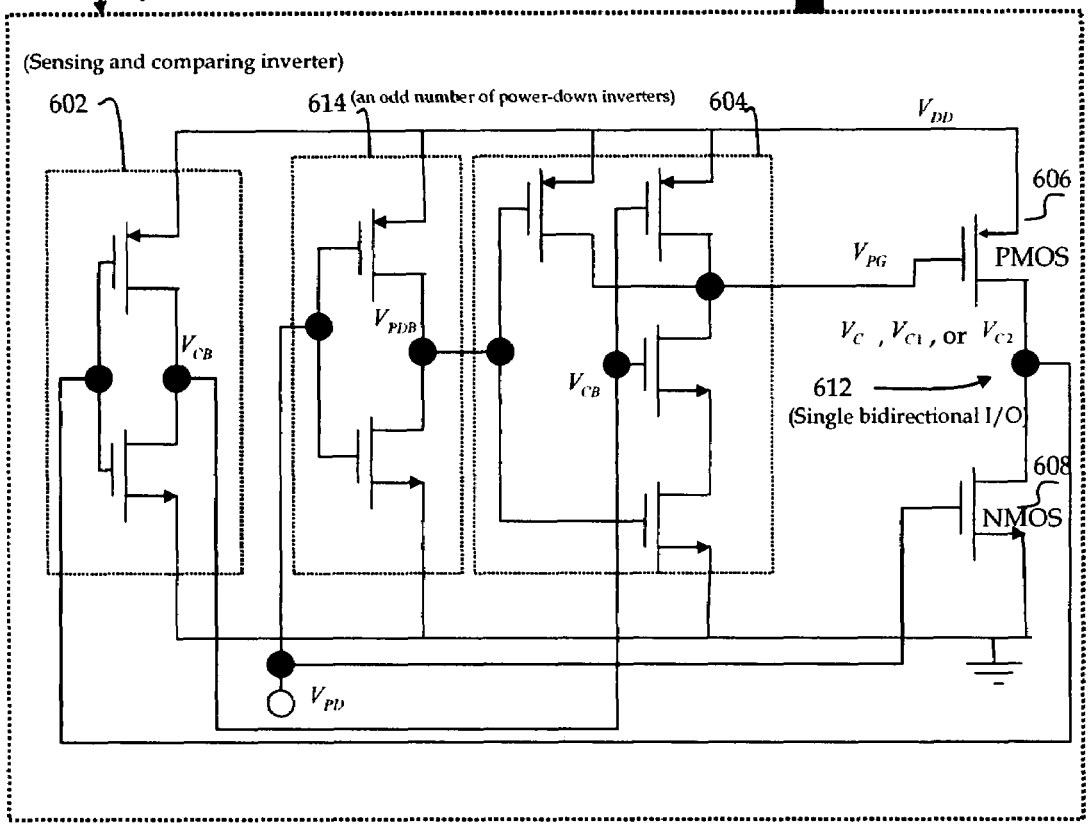

FIG. 6 illustrates an exemplary embodiment of a phase-locked loop including a power-down enable filter-based lock-in circuit in accordance with the present invention. The power-down enable filter-based lock-in circuit 630 basically consists of a PMOS transistor 606 and an NMOS transistor 608 that are connected in series between a power supply and ground in a path from the power supply to ground. The circuit 630 further comprises a sensing inverter 602, an odd number of power-down inverters 614, and a NAND gate 604. In this embodiment, the PMOS transistor 606 and NMOS transistor 608 have a shared drain terminal, which becomes a single bidirectional node 612 that is also connected to an input terminal of the sensing inverter 602. The power-down enable filter-based lock-in circuit 630 is based on the basic filter-based lock-in circuit 430, but the NAND gate 604 and the odd number of power-down inverters 614 were added to replace the odd number of inverters 404 in order to implement power down mode so that the NAND gate 604 functions as an inverter when $V_{PD}$ (i.e., power down pin voltage) is zero (i.e., the circuit 630 is in normal mode). It should be mentioned that the circuit 630 enters power-down mode when $V_{PD}$ is $V_{DD}$. In addition, it is noted that $V_{PDB}$ (i.e., power down bar voltage) is inverted from power down pin voltage. In addition, the circuit 630 was also developed using a general layout guideline to minimize LVS errors.

Figure 7:
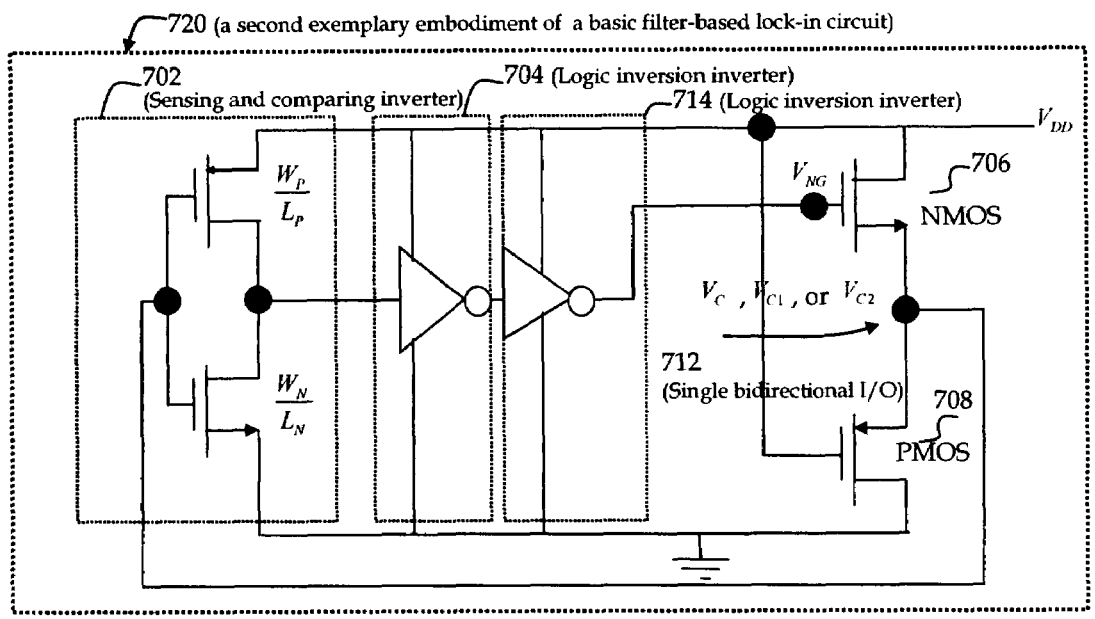
FIG. 7 illustrates a second exemplary embodiment of a basic filter-based lock-in circuit and a second exemplary embodiment of a power-down enable filter-based lock-in circuit according to the present invention.
Figure 7:
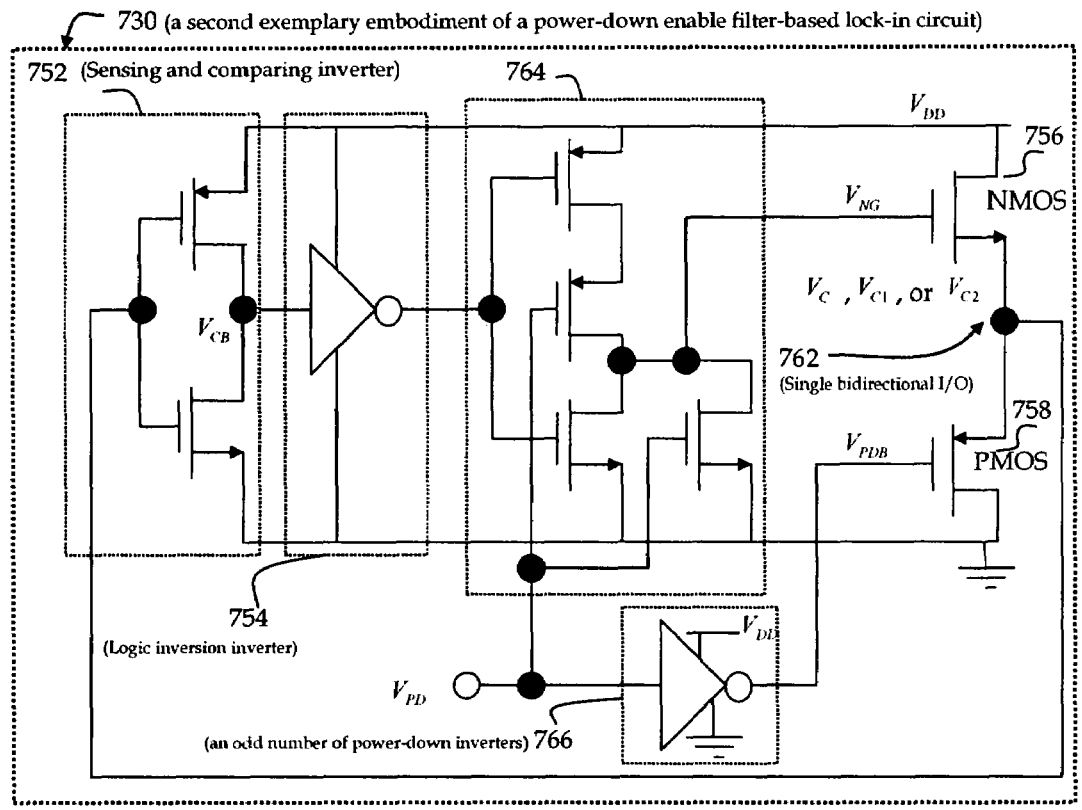

FIG. 7 illustrates a second exemplary embodiment of a basic filter-based lock-in circuit and a second exemplary embodiment of a power-down enable filter-based lock-in circuit according to the present invention. The basic filter-based lock-in circuit 720 basically consists of an NMOS transistor 706 and a PMOS transistor 708 that are connected in series between a power supply and ground in a path from the power supply to ground. The circuit 720 further comprises a sensing inverter 702 and two logic inversion inverters 704 and 714. In this embodiment, the NMOS transistor 706 and PMOS transistor 708 have a shared source terminal, which becomes a single bidirectional node 712 that is also connected to an input terminal of the sensing inverter 702. In addition, it should be aware that a gate terminal of the PMOS transistor 708 is connected to the power supply in order to turn off the PMOS transistor 708 all the time unless the gate terminal of the PMOS transistor 708 is connected to a voltage that is inverted from power down pin voltage.

A power-down enable filter-based lock-in circuit 730 basically consists of an NMOS transistor 756 and a PMOS transistor 758 that are connected in series between a power supply and ground in a path from the power supply to ground. The circuit 730 further comprises a sensing inverter 752, a logic inversion inverter 754, a NOR gate 764, and an odd number of power-down inverters 766. In this embodiment, the NMOS transistor 756 and PMOS transistor 758 have a shared source terminal, which becomes a single bidirectional node 762 that is also connected to an input terminal of the sensing inverter 752. The power-down enable filter-based lock-in circuit 730 is based on the basic filter-based lock-in circuit 720, but a combination of the NOR gate 764 and the odd number of power-down inverters 766 was added to replace the logic inversion inverter 714 in order to implement power down mode so that the NOR gate 764 functions as an inverter when $V_{PD}$ is zero (i.e., the circuit 730 is in normal mode). It should also be mentioned that the circuit 730 enters power-down mode when $V_{PD}$ is $V_{DD}$.

Figure 8:
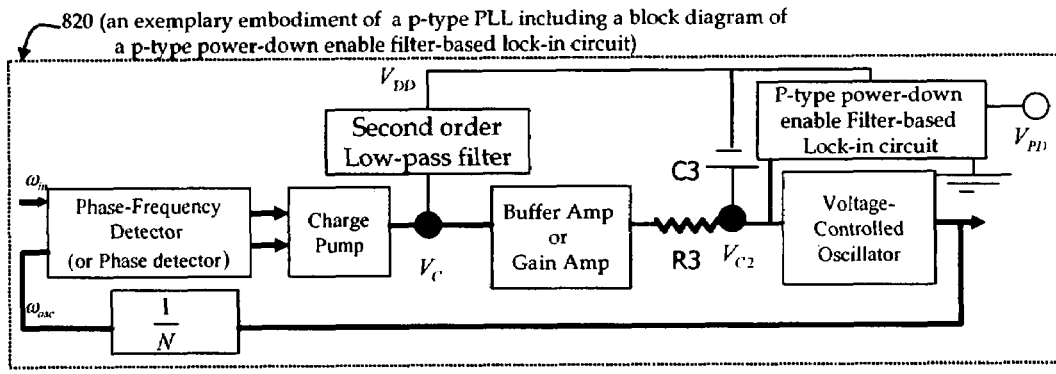
FIG. 8 illustrates an exemplary embodiment of a p-type phase-locked loop including a block diagram of a p-type power-down enable filter-based lock-in circuit and two exemplary embodiments of a p-type power-down enable filter-based lock-in circuit in accordance with the present invention.
Figure 8:
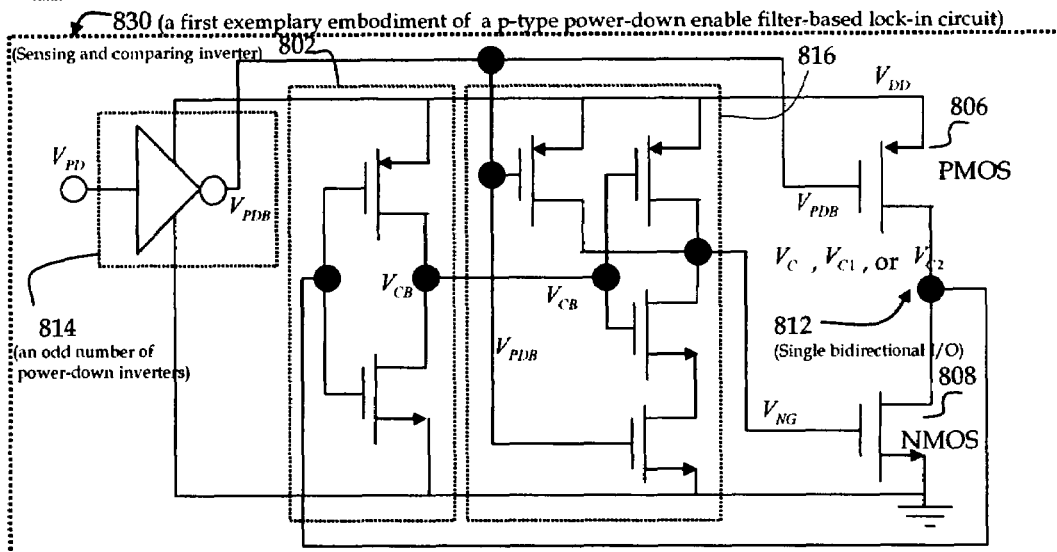
Figure 8:
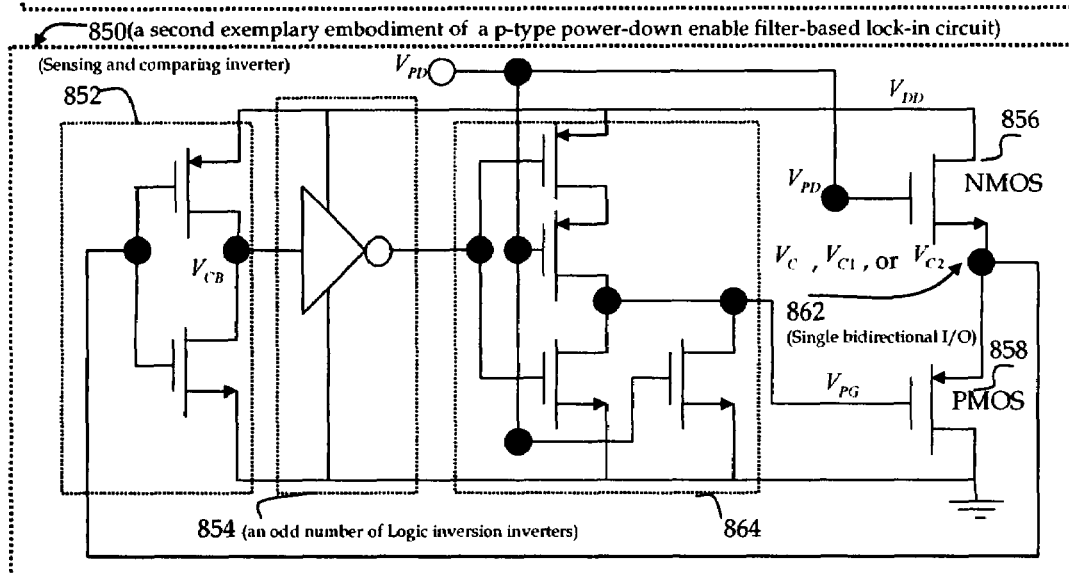

FIG. 8 illustrates an exemplary embodiment of a p-type phase-locked loop including a block diagram of a p-type power-down enable filter-based lock-in circuit and two exemplary embodiments of a p-type power-down enable filter-based lock-in circuit in accordance with the present invention. A first p-type power-down enable filter-based lock-in circuit 830 basically consists of a PMOS transistor 806 and an NMOS transistor 808 that are connected in series between a power supply and ground in a path from the power supply to ground. The circuit 830 further comprises a sensing inverter 812, an odd number of power-down inverters 814, and a NAND gate 816. In this embodiment, the PMOS transistor 806 and NMOS transistor 808 have a shared drain terminal, which becomes a single bidirectional node 812 that is also connected to an input terminal of the sensing inverter 802.

A second p-type power-down enable filter-based lock-in circuit 850 basically consists of an NMOS transistor 856 and a PMOS transistor 858 that are connected in series between a power supply and ground in a path from the power supply to ground. The circuit 850 further comprises a sensing inverter 852, an odd number of logic inversion inverters 854, and a NOR gate 864. In this embodiment, the NMOS transistor 856 and PMOS transistor 858 have a shared source terminal, which becomes a single bidirectional node 862 that is also connected to an input terminal of the sensing inverter 852.

Figure 9:
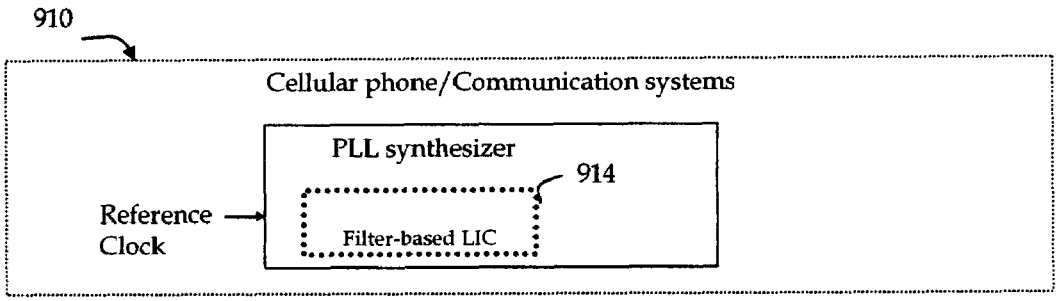
FIG. 9 illustrates cellular, SERDES, and clock distribution systems including a block diagram of a filter-based lock-in circuit to speed up system startup time according to the present invention.
Figure 9:
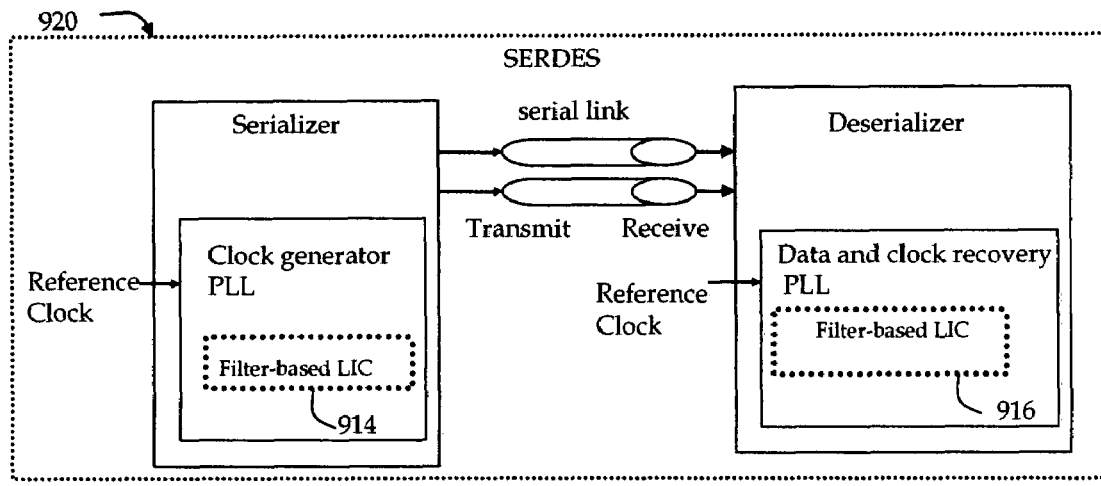
Figure 9:
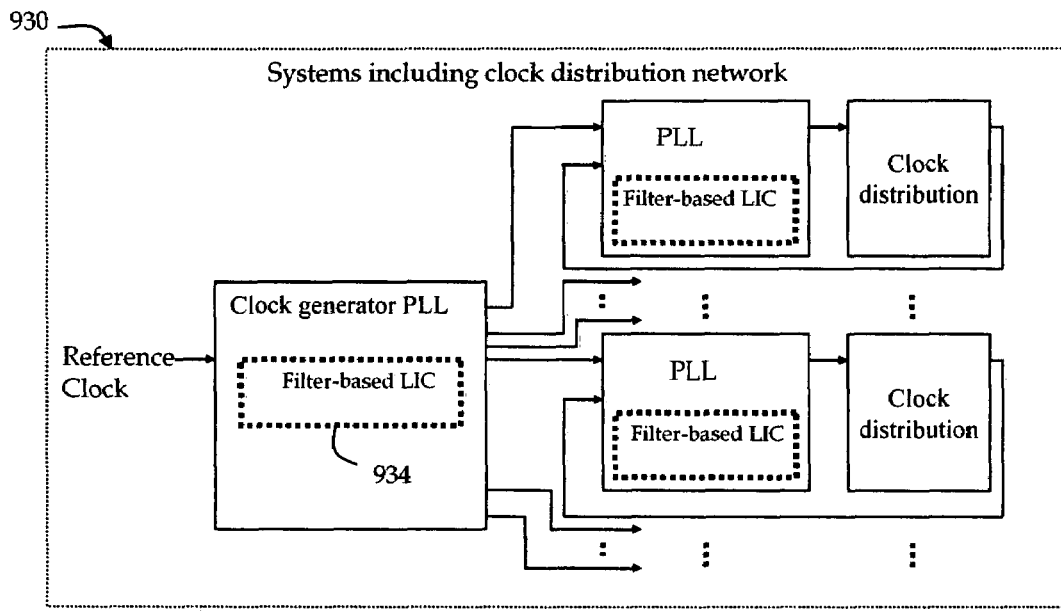
Figure 10:
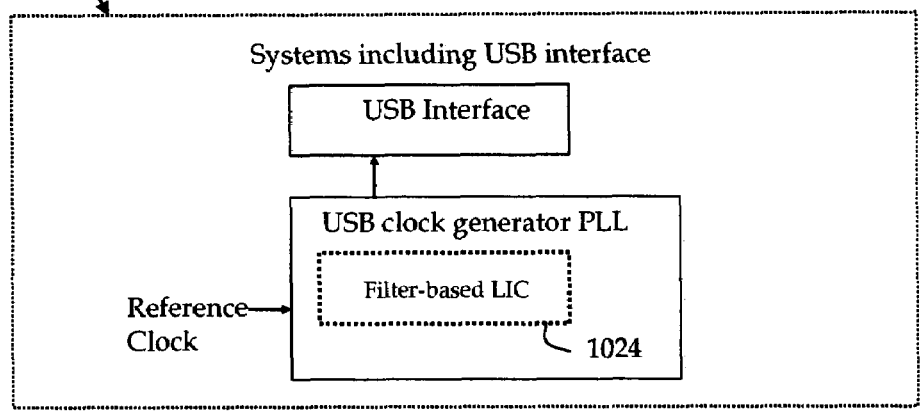
FIG. 10 illustrates USB, video decoder, and processor systems including a block diagram of a filter-based lock-in circuit to speed up system startup time in accordance with the present invention.
Figure 10:
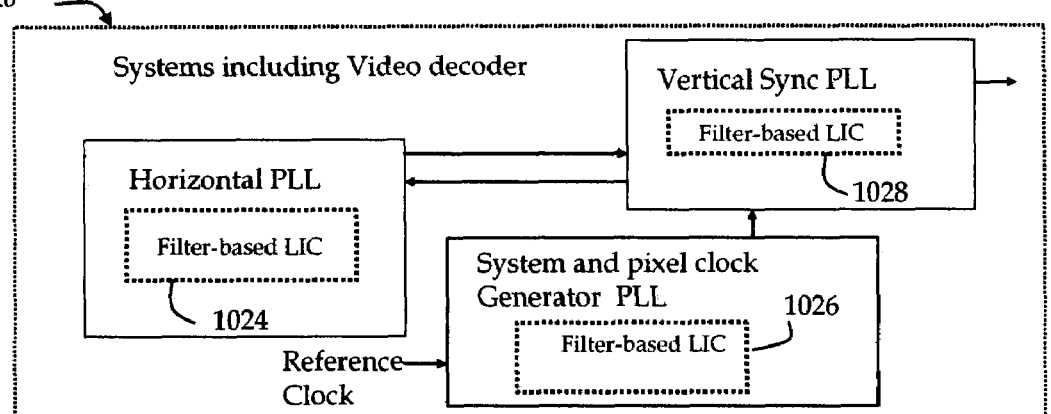
Figure 10:
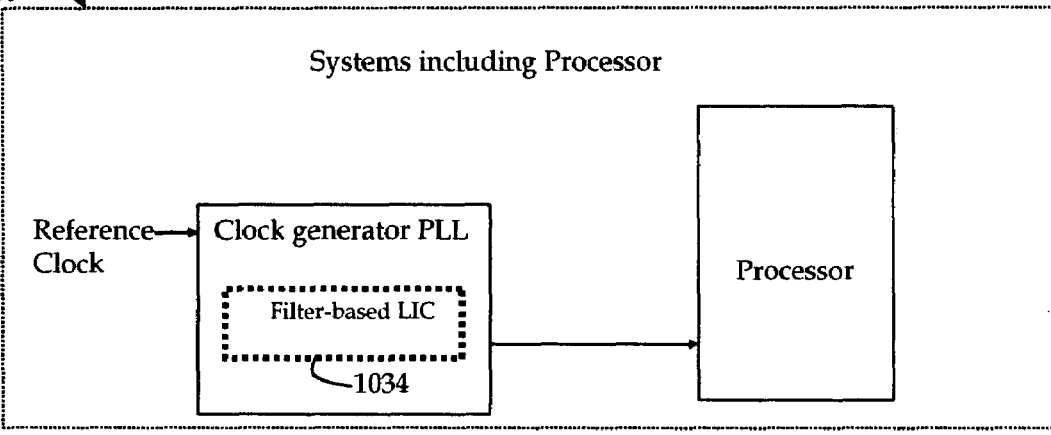
Figure 11:
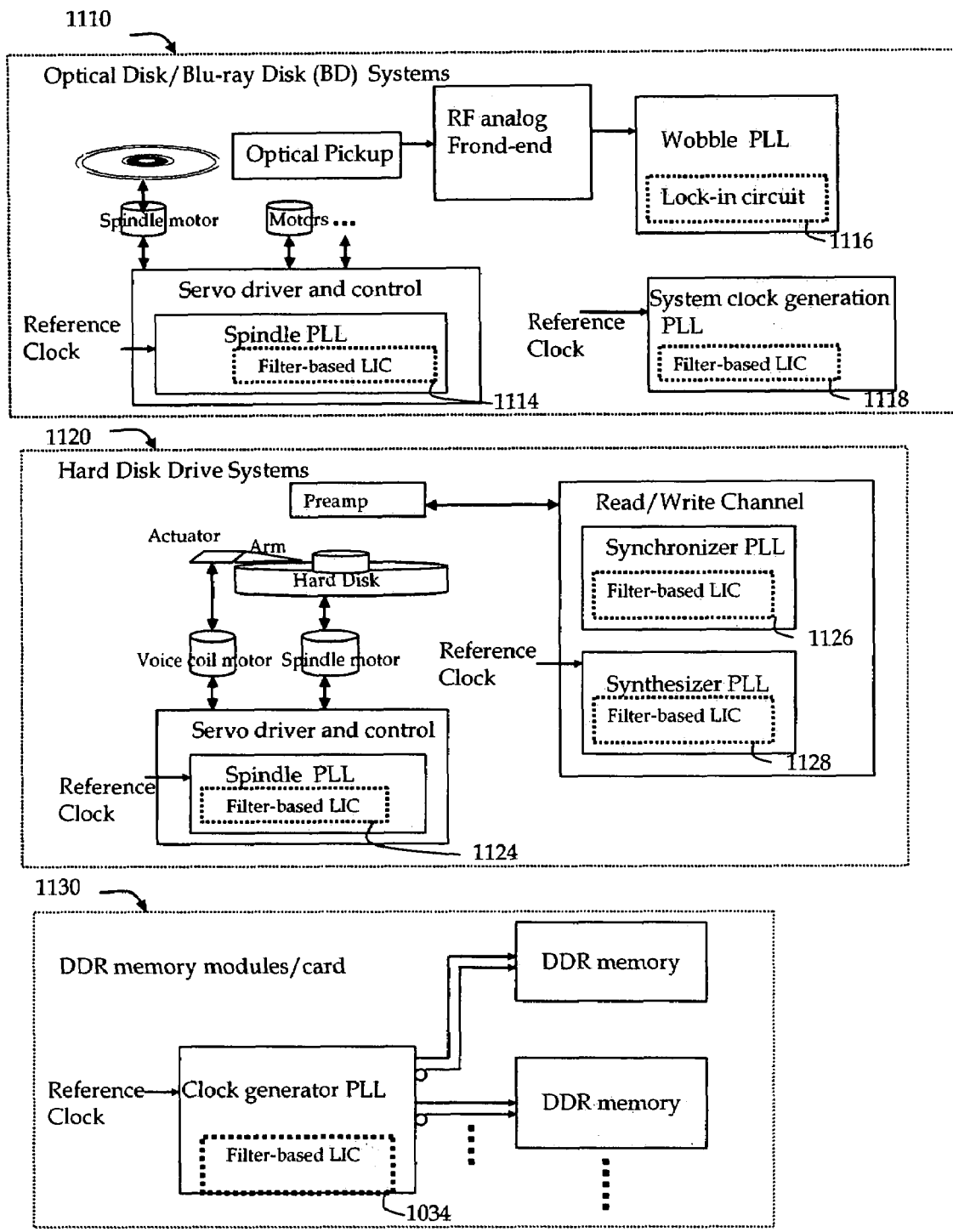
FIG. 11 illustrates optical disk, hard disk drive, and DDR memory module systems including a block diagram of a filter-based lock-in circuit to speed up system startup time according to the present invention.
Figure 12:
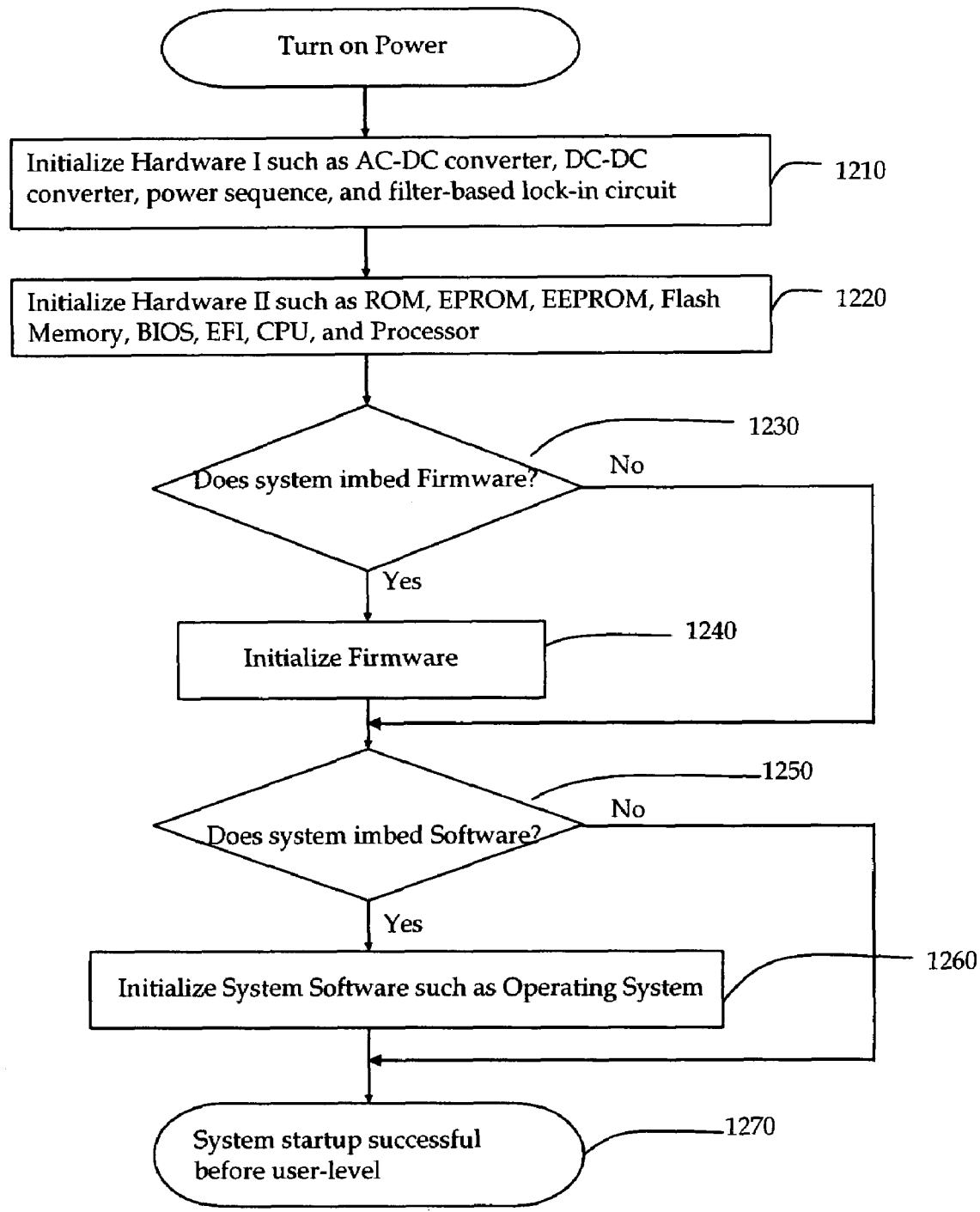
FIG. 12 illustrates a flow chart showing operation of the embodiments of FIG. 9, FIG. 10, and FIG. 11 in accordance with the present invention.

FIGS. 9, 10, and 11 illustrate systems including a block diagram of a filter-based lock-in circuit to speed up system startup time according to the present invention where the filter-based lock-in circuit indicates a circuit 430, 630, 720, 730, 830, or 850. FIG. 12 illustrates a flow chart showing operation of the embodiments of FIGS. 9, 10, and 11 in accordance with the present invention. It is also noted that R and $C_1$ shown in the second-order low-pass filter in FIGS. 2, 3, 4, 5, 6, and 8 can be exchangeable.

In summary, the upper transistor and the lower transistor have a shared source (or drain) terminal which becomes a single bidirectional node. An initial voltage at the single bidirectional node of the filter-based lock-in circuit is almost the same as an input transition voltage of a sensing inverter. Thus, all embodiments of the present invention solve serious harmonic locking problems, and are used in any system containing phase-locked loop so that a system including phase-locked loop(s) should not have long wait time. All embodiments of the present invention are able to provide 45 microsecond lock-in time or less, which is quick enough to fully meet current and future fast system startup (or low system latency) needs.

All embodiments of the present invention have been developed for use in subsystem, system-on-chip, system IC, memory, telecommunication, communication, navigation system, computer, computer peripherals, automotive, networks, digital systems, consumer electronics, industrial, instrumentation, etc. Examples of communication include wireless, DSL, Gigabit Ethernet, WAL, LAN, MAHO (i.e., mobile-assisted hand-off operation), GSM, CDMA, AMPS, TDMA, cellular/PCS handset, GSM evolution GPRS, HSCSD, EDGE, RBDS, and future generation mobile technology, etc. Examples of computer peripherals include copiers, fax, and flat panel displays, printers, DVD and CD burners, etc. Examples of consumer electronics include audio, digital camera, VoIP (i.e., voice-over-internet protocol) phone, TV, DTV, HDTV, set-top boxes, radio, game consoles, PDA, MP3, etc. Examples of subsystem include microprocessor, DSP (i.e., digital signal processor), audio codec, video decoder, radio, hard disk, digital systems, digital interfaces, USB, SERDES, A/D converter, light processing, etc.

In addition, all embodiments of the present invention have been developed for use in a complete system simulation and fully satisfy time-to-market requirement to quickly, realistically, and accurately simulate a complete system incorporating all design components including PLL(s) before tape-out. Furthermore, all embodiments of the present invention have been developed for use in system bootup time and system test time reduction. Moreover, all embodiments of the present invention have enabled users to save time booting up their low-end systems such as personal computers, single-user workstations, and game consoles, and have highly reduced time for tests such as ad-hoc test, pseudo-random sequence generator (i.e., PRSG), built-in self-test (i.e., BIST), and stop-on-count-or-error (i.e., SOCE) that require clock generator PLL(s) on chip, card, board, or system. Shorter system simulation time and system test time translate into tremendous cost saving and greatly decrease time to market. A certain number of filter-based lock-in circuits can be needed within a fast startup time system, depending on a number of phase-locked loops that the fast startup time system includes. Even though the filter-based lock-in circuit of the present invention is used within phase-locked loop structure, the functional effect of the present invention on system startup time is tremendous. The present invention provides filter-based lock-in circuits to speed up system startup time and attains a drastic improvement in system startup time, system latency time, system simulation time, system test time, and time-to-market.

While the present invention has been described in particular embodiments, it should be appreciated that the present invention should not be construed as being limited by such embodiments, but rather construed according to the claims below.

What is claimed is:

1. A filter-based lock-in circuit used in a system for reducing system startup time and system latency time, comprising:
   an upper transistor and a lower transistor connected in series between a power supply and ground having a shared terminal which becomes a single bidirectional node, wherein the shared terminal is defined by a junction between the upper transistor and the lower transistor;
   a sensing inverter for sensing a voltage at the single bidirectional node and comparing it with an input transition voltage of the sensing inverter which causes an output of the sensing inverter to be centered at half the power supply voltage wherein an input terminal of the sensing inverter is connected to the single bidirectional node;
   a logic gate coupled between an output terminal of the sensing inverter and a gate terminal of the upper transistor; and
   wherein an initial voltage at the single bidirectional node of the filter-based lock-in circuit is almost the same as the input transition voltage of the sensing inverter.

2. The circuit as recited in claim 1 wherein the upper transistor and the lower transistor are a PMOS transistor and an NMOS transistor, respectively, the shared terminal is a drain terminal that the PMOS transistor and the NMOS transistor have, and the logic gate comprises an odd number of inverters, wherein the NMOS transistor has a gate terminal which is connected to ground.

3. The circuit as recited in claim 1 wherein the upper transistor and the lower transistor are a PMOS transistor and an NMOS transistor, respectively, the shared terminal is a drain terminal that the PMOS transistor and the NMOS transistor have, and the logic gate comprises a two-input NAND gate, which is used as an enabling inverter with one input voltage inverted from a power-down pin voltage and the other input terminal coupled to the output terminal of the sensing inverter, wherein the NMOS transistor has a gate terminal which is connected to a power-down pin and is at ground during normal mode.

4. The circuit as recited in claim 1 wherein the upper transistor and the lower transistor are an NMOS transistor and a PMOS transistor, respectively, the shared terminal is a source terminal that the NMOS transistor and the PMOS transistor have, and the logic gate comprises an even number of inverters, wherein the PMOS transistor has a gate terminal which is connected to the power supply.

5. The circuit as recited in claim 1 wherein the upper transistor and the lower transistor are an NMOS transistor and a PMOS transistor, respectively, the shared terminal is a source terminal that the NMOS transistor and the PMOS transistor have, and the logic gate comprises a combination of an inverter and a two-input NOR gate, wherein the NOR gate is used as an enabling inverter with one input voltage serving as a power-down pin voltage and the other input voltage inverted from the output voltage of the sensing inverter, wherein the PMOS transistor has a gate terminal which is inverted from the power-down pin and is at the power supply during normal mode.

6. The circuit as recited in claim 1 wherein the single bidirectional node of the filter-based lock-in circuit is also connected to a terminal, which is defined by a junction between a resistor and capacitor in a low-pass filter of a phase-locked loop.

7. The circuit as recited in claim 1 wherein the filter-based lock-in circuit is developed for use in simulating a complete system quickly, realistically, and accurately which incorporates all design components including at least a phase-locked loop before tape-out.

8. The circuit as recited in claim 1 wherein the system is a communication system.

9. The circuit as recited in claim 1 wherein the system is a computer system.

10. The circuit as recited in claim 1 wherein the system is a computer peripheral system.

11. The circuit as recited in claim 1 wherein the system is a consumer electronics system.

12. The circuit as recited in claim 1 wherein the system is an automotive system.

13. The circuit as recited in claim 1 wherein the system is an industrial system.

14. The circuit as recited in claim 1 wherein the system is an instrumentation system.

15. The circuit as recited in claim 1 wherein the system is a cellular phone system.

16. The circuit as recited in claim 1 wherein the system is a digital signal processor system.

17. The circuit as recited in claim 1 wherein the system is a central process unit system.

18. The circuit as recited in claim 1 wherein the system is a clock distribution system.

19. The circuit as recited in claim 1 wherein the system is a memory system.

20. The circuit as recited in claim 1 wherein the filter-based lock-in circuit is developed for use in all types of systems containing at least a phase-locked loop without regard to architecture and topology.

* * * * *